United States Patent [19]

Hsieh

[11] Patent Number: 4,820,937
[45] Date of Patent: Apr. 11, 1989

[54] TTL/CMOS COMPATIBLE INPUT BUFFER

[75] Inventor: Hung-Cheng Hsieh, San Jose, Calif.

[73] Assignee: Xilinx, Incorporated, San Jose, Calif.

[21] Appl. No.: 778,344

[22] Filed: Sep. 19, 1985

[51] Int. Cl.$^4$ .................. H03K 19/094; H03K 19/092
[52] U.S. Cl. .................................... 307/475; 307/264; 307/448
[58] Field of Search ................... 307/296 R, 297, 448, 307/451, 481, 475, 264

[56] References Cited

U.S. PATENT DOCUMENTS

| | | |
|---|---|---|
| 4,032,795 | 6/1977 | Hale . |
| 4,258,272 | 3/1981 | Huang . |
| 4,430,582 | 2/1984 | Bose et al. ........................ 307/475 |
| 4,438,352 | 3/1984 | Mardkha . |
| 4,469,959 | 9/1984 | Luke et al. . |
| 4,471,242 | 9/1984 | Noufer et al. . |
| 4,472,647 | 9/1984 | Allgood et al. . |
| 4,475,050 | 10/1984 | Noufer . |
| 4,490,633 | 12/1984 | Noufer et al. . |
| 4,504,747 | 3/1985 | Smith et al. ........................ 307/475 |
| 4,563,595 | 1/1986 | Bose ................................... 307/290 |
| 4,584,492 | 4/1986 | Sharp ................................. 307/475 |
| 4,587,447 | 5/1986 | Baehring ............................ 307/482 |
| 4,612,461 | 9/1986 | Sood .................................. 307/475 |

FOREIGN PATENT DOCUMENTS

| | | |
|---|---|---|
| 0154337 | 9/1985 | European Pat. Off. . |
| 2708021 | 11/1979 | Fed. Rep. of Germany . |
| 227843 | 9/1985 | Fed. Rep. of Germany . |
| 2130833 | 6/1984 | United Kingdom . |

OTHER PUBLICATIONS

B. L. Dokic, "CMOS Schmitt Triggers", IEEE Proceedings, vol. 131, part G, No. 5, Oct. 1984, pp. 197-202, Old Woking, Surrey, Great Britain.

P. R. Gray, R. G. Meyer, "Analysis and Design of Analog Integrated Circuits", pp. 741-749, 752, John Wiley & Sons (2nd ed.), 1984.

Branko Dokic, "Modified CMOS Inverters", 2218 Microelectronics Journal, vol. 14 (1983), Jul./Aug., No. 4, Kirkcaldy, Great Britain.

Primary Examiner—John Zazworsky
Attorney, Agent, or Firm—Skjerven, Morrill, MacPherson, Franklin & Friel

[57] ABSTRACT

A TTL/CMOS compatible input buffer includes an input inverter and a reference voltage generator. In the TTL mode, the reference voltage generator supplies a reference voltage to the source of the P-channel transistor in the inverter having a magnitude which forces the trigger point of the input inverter to assume a preselected value. Typically the preselected value is selected to be 1.4 volts in order to maximize the input noise margins. A second stage input inverter introduces hysteresis to improve the noise immunity of the system. The reference voltage generator includes an operational amplifier connected to a voltage divider network. In the CMOS mode, the reference voltage generator is disabled and a voltage equal to power supply voltage is provided to the input inverter. As a result, the trigger point of input inverter is higher than 1.4 volts which provides a larger input noise margin. The voltage divider network and the operational amplifier are powered down so that no DC power is consumed.

18 Claims, 4 Drawing Sheets

TTL/CMOS COMPATIBLE INPUT BUFFER

FIELD OF THE INVENTION

This invention relates to a TTL/CMOS compatible input buffer and in particular to a TTL/CMOS input buffer having optimal noise margins in the TTL mode which are independent of process parameters.

BACKGROUND

Conventional bipolar integrated circuits operate at low voltage logic levels. Typically, a low or logical "0" for TTL logic circuits ranges from 0.0 to 0.8 volts and a high or logical "1" ranges from 2.0 to 5.0 volts. Thus in order to distinguish between a logical 0 and a logical 1 a CMOS inverter must be capable of switching somewhere between 0.8 and 2.0 volts and preferably at approximately 1.4 volts in order to provide the widest possible noise margins.

On the other hand, a CMOS inverter generally operates at voltages of 4.5 to 15 volts with 5 volts being typical. If the source of the P-channel transistor in the CMOS inverter is connected to a voltage of 5 volts, the P-channel transistor will draw a steady state current when a TTL logical "1" as low as 2.0 volts is applied to its gate. Hence it is desirable to establish the switching or trigger point of the CMOS input inverter in a TTL to CMOS buffer at approximately 1.4 volts to maximize noise margins, and to provide a voltage of less than 5 volts on the sources of P-channel transistor in the input buffer in order to reduce steady state power consumption.

Several issued patents have addressed this latter concern. For example, U.S. Pat. No. 4,471,242 issued Sept. 11, 1984 to Noufer, et al. which is incorporated herein by reference, describes a TTL to CMOS input buffer which accomplishes buffering a TTL signal to a CMOS signal with low current flow through a CMOS input inverter in a static (non-switching) condition. This is achieved by providing a selected reference voltage to the source of the P-channel transistor in the CMOS input inverter. The reference voltage is selected to be less than the lower voltage level of the TTL logical "1" (2.0 volts) minus the threshold voltage of the P-channel transistor.

Similarly, U.S. Pat. No. 4,475,050 issued to Noufer on Oct. 2, 1984 which is incorporated herein by reference, prevents current flow through the CMOS inverter of the TTL to CMOS input buffer by providing a reference voltage to the source of the P-channel transistor in the input inverter which is responsive to the voltage level of the TTL input signal.

U.S. Pat. No. 4,469,959, issued to Luke et al. on Sept. 4, 1984, which is incorporated herein by reference, describes a bypass means which compensates for the body effect of the load transistor to maintain the switch point of the input inverter stage at a "relatively" constant value, which is subject to process variations.

The prior art does not however solve the problem of establishing a trigger point of the input inverter in a CMOS buffer at a selected voltage level. As long as the supply voltage of the CMOS inverter does not vary significantly from a fixed level, one can attempt to approximately establish the desired trigger point by selecting the ratios of channel width to channel length in the N-channel and P-channel transistor of the input inverter in the CMOS buffer. However, this solution is inadequate because the trigger point is then sensitive to variations in process parameters as well as to variations in power supply.

SUMMARY OF THE INVENTION

A TTL to CMOS input buffer is disclosed which permits the trigger point of the input inverter in the CMOS input buffer to be established at a selected level which is typically chosen to maximize input noise margins. The trigger point of the input inverter is established by forcing the trigger point to the selected value in response to a reference voltage. The trigger point has a low sensitivity to variations in process parameters and power supply noise. The buffer has high speed, low or no DC power dissipation at TTL input levels, and no power dissipation at CMOS input levels. The CMOS buffer includes a reference voltage generator that generates a reference voltage which when applied to the source of the P-channel transistor in the CMOS input inverter of the buffer causes the trigger point of the inverter to assume the selected voltage level. In establishing this selected trigger point it is desirable to first establish the ratios of channel width to channel length for the transistors in the input buffer that should nominally yield the selected trigger point assuming a selected source voltage. Depending on design considerations this selected source voltage can be chosen to be less than $V_{CC}$ to prevent the P-channel transistor in the input buffer from turning on when TTL input signal is at a logic high such that the input buffer consumes low or no DC power at TTL input levels. For a properly selected source voltage less than $V_{CC}$, the ratio of the ratio of the channel width to channel length of the P-channel transistor to the ratio of the channel width to channel length of the N-channel transistor need not be heavily skewed (a ratio of 3:1 is considered not skewed since an N-channel transistor is about three times more conductive than an equal size P-channel transistor). As a result, the speed characteristic of the input buffer is improved. Since the actual trigger point of such an inverter may vary substantially from the nominal value, a reference voltage generator is provided which generates a reference voltage that acts as the positive supply voltage for the input inverter and forces the trigger point of the input inverter to assume the desired level, typically 1.4 volts when the buffer is in the TTL mode. In the TTL mode the reference voltage generator includes a first reference voltage generator which generates a first reference voltage having a magnitude equal to the selected level (i.e. the desired trigger point). This first reference voltage is supplied to an operational amplifier whose other input is the common drain voltage of a reference "inverter" whose transistors have common gate and drain connections and the same ratio of channel ratios as the corresponding transistors in the CMOS input inverter. In one embodiment, the output of the operational amplifier controls a transistor which charges the source of a P-channel transistor in the reference inverter to the level which forces the trigger point of the input inverter to the selected level. In one embodiment, the output of the input inverter swings between 0 volts and the reference voltage. In another embodiment having a second stage inverter, the output of the input inverter swings between 0 volts and the greater of the reference voltage or $V_{CC}\text{-}T_{TH,N}$ where $V_{TH,N}$ is the threshold voltage of an N-channel transistor. The second stage inverter converts the output of the first stage to CMOS levels and provides additional stability by introducing hysteresis into the circuit so that the trigger point of the second stage inverter is lower when its input voltage is falling than when its input voltage is rising.

When the TTL/CMOS buffer is operating in the CMOS mode the voltage supplied to the input inverter is equal to the power supply voltage, thereby increasing the trigger point of the input inverter which improves the input noise margin.

As a feature of the invention, the first reference generator and the operational amplifier are disabled when the buffer is in the CMOS mode so that no DC power is consumed by these circuits.

DETAILED DESCRIPTION

Figure 1:
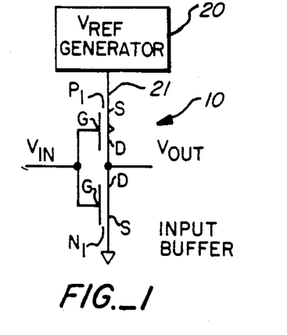
FIG. 1 shows a schematic diagram of the TTL/CMOS input buffer of the present invention.

FIG. 1 shows a schematic diagram of one embodiment of the TTL/CMOS compatible input buffer of the present invention. The input buffer includes inverter 10 which includes P-channel enhancement mode transistor P1 and N-channel enhancement mode transistor N1. In FIG. 1 and in the following figures, a gate, source and drain of each transistor is labelled by G, S, and D, respectively. All transistors in this embodiment are enhancement mode transistors. The gates G of transistors P1 and N1 are connected to input lead $V_{IN}$ of inverter 10 and the drains D of transistors $P_1$ and $N_1$ are connected to the output lead $V_{OUT}$ of inverter 10. Source S of transistor $P_1$ is connected to output lead 21 of reference voltage generator 20 and source S of transistor N1 is connected to ground.

When the input buffer operates in the TTL mode, i.e. when the signals on input lead $V_{IN}$ of the input buffer are at TTL levels switching between 0.8 volts (low) and 2.0 volts (high), one desirable voltage level of reference voltage $V_{REF}$ on lead 21 is approximately 3.5 volts so that the DC power loss of the input buffer is substantially reduced from the DC power loss that would result if the reference voltage $V_{REF}$ were at $V_{CC}$ (typically 5 volts). The DC power loss is the power loss due to the steady state current flowing from reference generator 20 through transistor P1 and N1 to ground.

It is also desirable that when inverter 10 is in the steady (nonswitching) state that the trigger (trip) point of inverter 10 be at or near the midpoint of the TTL voltage levels (approximately 1.4 volts) in order to maximize the input noise margin. The trigger point of an inverter is the voltage level at which the input voltage equals the output voltage.

The trigger point of inverter 10 is determined by the ratio of the channel width to channel length of transistor P1 and by the ratio of the channel width to channel length of transistor N1 and by the magnitude of the reference voltage $V_{REF}$ applied to source S of the transistor P1. When the magnitude of the reference voltage is approximately 3.5 volts the ratio of the channel width to channel length of transistor P1 compared to the ratio of channel width to channel length of transistor N1 does not need to be heavily skewed in order to cause the trigger point of inverter 10 to be at the midpoint (approximately 1.4 volts) of the TTL input voltage range. This permits an inverter with a faster switching speed than would be the case if the ratio were more heavily skewed to produce a 1.4 volt trigger point for a source voltage of 5 volts ($V_{CC}$). In one embodiment, the channel width of transistor P1 is 30 μm and the channel length of transistor P1 is 2.5 μm. The channel width of transistor N1 is 10 μm, and the channel length of transistor N1 is 2.5 μm. In this invention however, $V_{REF}$ is varied from 3.5 volts in order to establish the trigger point of inverter 1 at a selected level, typically the midpoint of the TTL range, despite variations in process parameters which would otherwise cause inverter 10 to have a higher or lower trigger point. In other words, the magnitude of $V_{REF}$ is generated which forces the trigger point of inverter 10 to be a selected value (typically the midpoint) between the low (approximately 0.8 volts) and high (approximately 2.0 volts) TTL levels, despite process parameter variations and perturbations in the supply voltage.

When inverter 10 is in the CMOS mode, i.e. when the voltage levels on input lead $V_{IN}$ vary between 0 volts (low) and $V_{CC}$ (high, typically 5 volts), $V_{REF}$ is maintained at $V_{CC}$ which increases the trigger point of inverter 10 above 1.4 volts (to approximately 2.5 volts when $V_{CC}$ equals 5 volts) thus improving noise margins.

Figure 2:
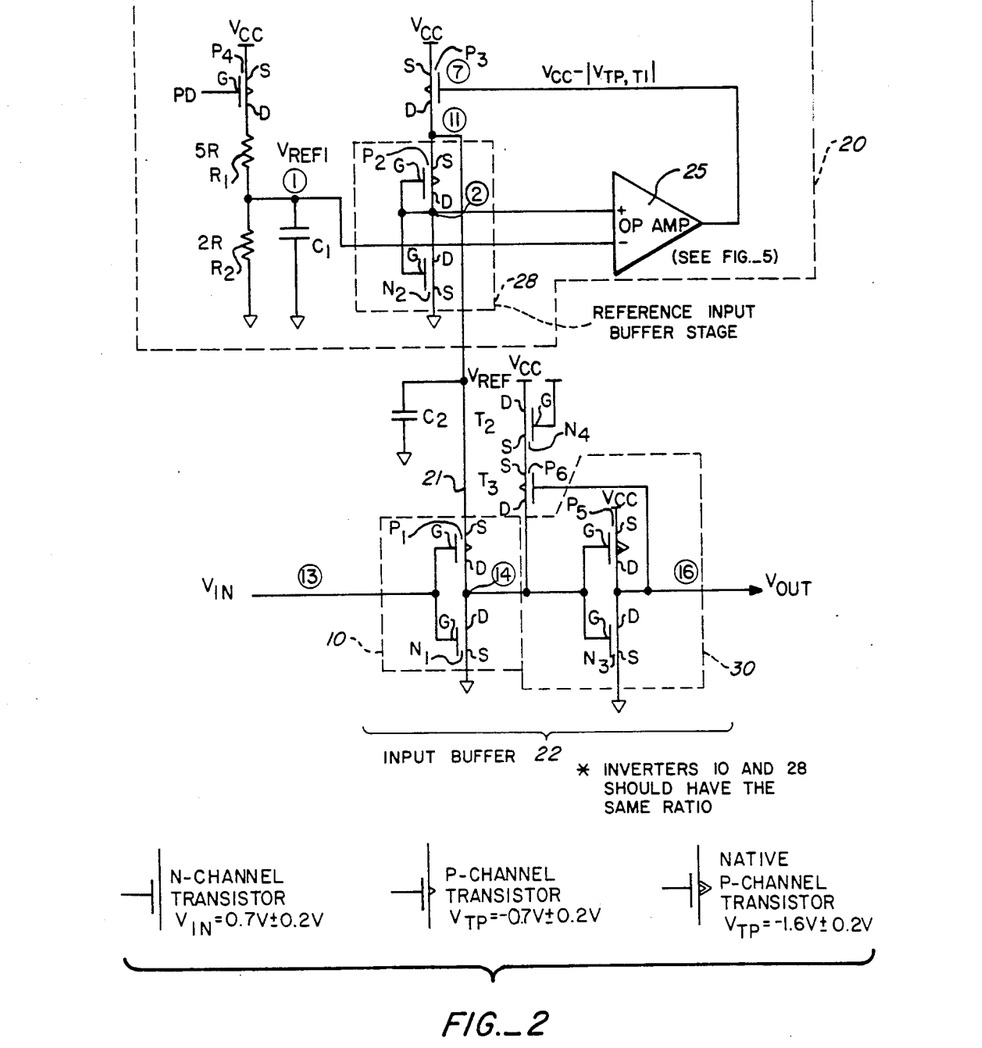
FIG. 2 shows one embodiment of the voltage reference generator and input inverter shown in FIG. 1 together with a second stage of the input buffer.

FIG. 2 shows a schematic diagram of reference voltage generator 20 together with input buffer 22 which includes inverter 10 (also shown in FIG. 1) and hysteresis circuit 30. A schematic diagram of operational amplifier 25 of reference voltage generator 20 is shown in FIG. 5 together with auxiliary mode control circuitry.

Figure 5:
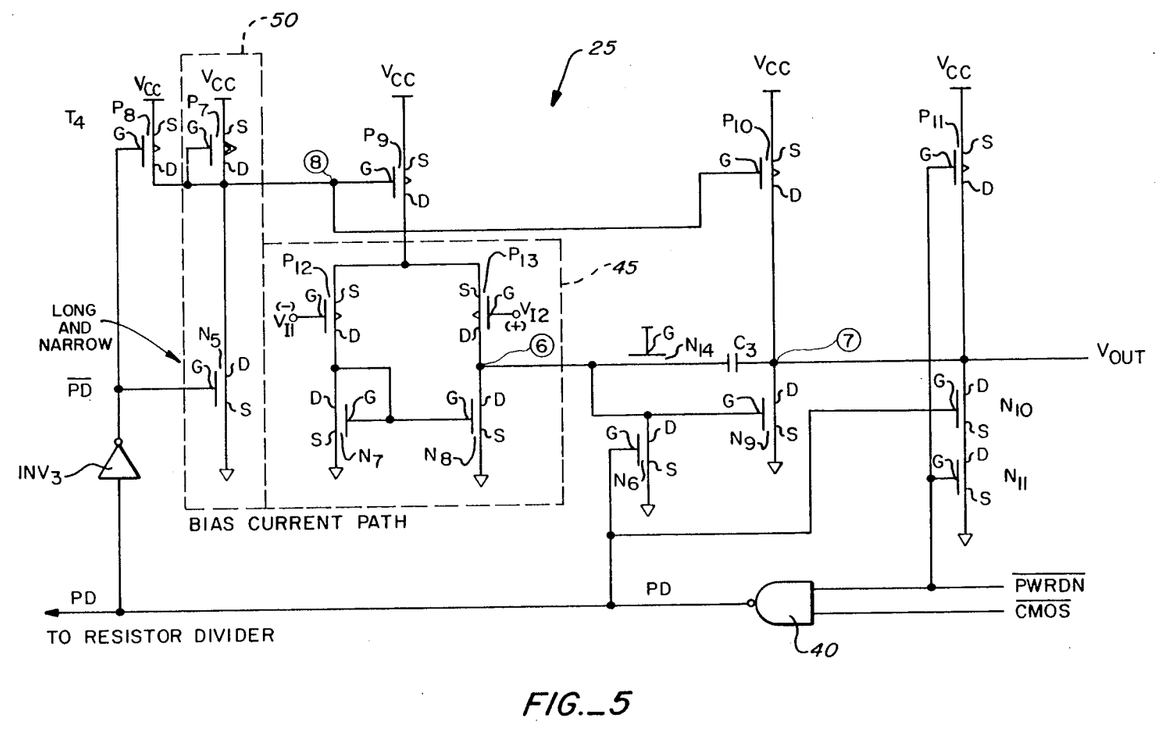
FIG. 5 shows one embodiment of the operational amplifier and the reference voltage generator together with logical control circuitry.

When it is desired to operate input buffer 22 in the TTL mode the control signals power down, denoted by $\overline{PWRDN}$ and control signal $\overline{CMOS}$ are set to 1 (see FIG. 5). These control signals are supplied to the input leads of NAND gate 40 causing the power down output signal PD of NAND gate 40 to be 0 volts. This low (0 volts) PD signal is applied to gate G of P-channel enhancement mode transistor P4 (shown in FIG. 2) turning P4 on. The source of transistor P4 is connected to $V_{CC}$ and the drain of transistor P4 is connected to resistor $R_1$ which is connected to node 1 which is connected to ground via resistor $R_2$. The values of resistors $R_1$ and $R_2$ are selected so that when transistor P4 is on, the reference voltage on node 1 denoted by $V_{REF1}$ is equal to the desired trigger point of inverter 10. The desired trigger point of inverter 10 is a selected value between the low level TTL signal (0.8 volts) and the high level TTL signal (2.0 volts). In the preferred embodiment, resistors $R_1$ and $R_2$ are selected so that the first reference voltage $V_{REF1}$ is at the midpoint of the range of TTL values (approximately 1.4 volts). The voltage $V_{REF1}$ on node 1 is applied to the inverting input lead of operational amplifier 25. Capacitor $C_1$ is connected between node 1 and ground to smooth the glitches caused by perturbations in the power supply. The noninverting input lead of operational amplifier 25 is connected to output node 2 of reference input buffer stage 28. Reference input buffer stage 28 comprises P-channel transistor $P_2$ and N-channel transistor $N_2$. Source S of transistor $P_2$ is connected to the output node of reference voltage generator 20 and to drain D of P-channel transistor $P_3$ whose gate G is controlled by the output signal of operational amplifier 25. Drain D of transistor $P_2$ is connected to drain D of transistor $N_2$ whose source S is connected to ground. Gates G of transistor $P_2$ and $N_2$ are connected to node 2 which is connected to the drains of transistors $P_2$ and $N_2$. The ratio of the ratio of the channel width to channel length of transistor $P_2$ to the ratio of the channel width to channel length of transistor $N_2$ in reference input buffer stage 28 is chosen to be the same as the ratio of the ratio of the channel width to channel length of transistor $P_1$ to the ratio of the channel width to channel length of transistor $N_1$ in inverter 10. Since these ratios are identical and since the voltage on node 11, the source of transistor $P_2$, is the same as the voltage $V_{REF}$ on the source of transistor $P_1$ and since the voltage on the gates of transistors $P_2$ and $N_2$ is the same as the voltage on node 2 connected to the drains of transistors $P_2$ and $N_2$, the trigger point of inverter 10 is the voltage on node 2. Node 2 is connected to the noninverting input lead of operational amplifier 25. The output of operational amplifier 25 controls the gate of P-channel pass transistor $P_3$. The source of transistor $P_3$ is connected to the positive voltage supply $V_{CC}$ and the drain of transistor $P_3$ is connected to the source of transistor $P_2$. Pass transistor $P_3$ is typically large since it supplies transient current for all input buffers (not shown) similar to input buffer 22 which are connected to the output lead 21 of reference voltage generator 20. In one embodiment, P-channel transistor $P_3$ has width 1500 $\mu$m and length 2.5 $\mu$m. Due to the large size of transistor $P_3$ and small steady state current required by input buffers, the gate voltage of transistor $P_3$ is biased at a level slightly lower than $V_{CC} - |V_{TH,P3}|$ where $V_{TH,P3}$ is the threshold voltage of transistor $P_3$. Since the first selected reference voltage $V_{REF1}$ on node 1 is connected to the inverting input lead of operational amplifier 25, and the voltage on node 2 is connected to the noninverting input lead of operational amplifier 25, operational amplifier 25 forces the voltage on node 2 to be equal to the first selected reference voltage $V_{REF1}$ due to the large voltage gain (typically greater than 50) of the operational amplifier. The voltage on node 11, $V_{REF}$ is suitably self-adjusted (either increased or decreased) to allow voltage at node 2 to be equal to $V_{REF1}$.

When inverter 10 switches, the transient current flowing through transistors $P_1$ and $N_1$ to ground causes the reference voltage $V_{REF}$ on node 11 to drop which in turn causes the voltage on node 2 to decrease which in turn causes the output signal of operational amplifier 25 to turn on transistor $P_3$ to charge up node 11 to the level required to cause the voltage on node 2 to return to $V_{REF1}$. Capacitor $C_2$ is a large capacitor connected to output lead 21 of reference voltage generator 20 in order to stabilize the reference voltage and to help meet the transient current requirements during switching of inverter 10. In one embodiment capacitor $C_2$ has a capacitance of 50 picofarads. The voltage on output node 14 of inverter 1 swings between 0 volts and $V_{REF}$ or $V_{CC} - V_{TH,N4}$, whichever is higher, as will now be explained.

Figure 3:
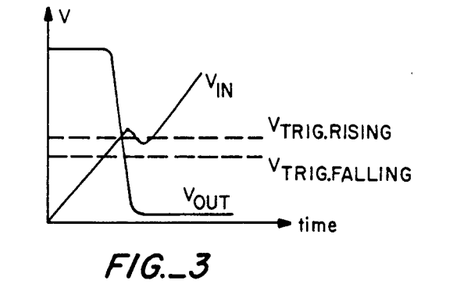
FIG. 3 shows a graph of the input voltage versus the output voltage as a function of time for the second stage of the input buffer.
Figure 4:
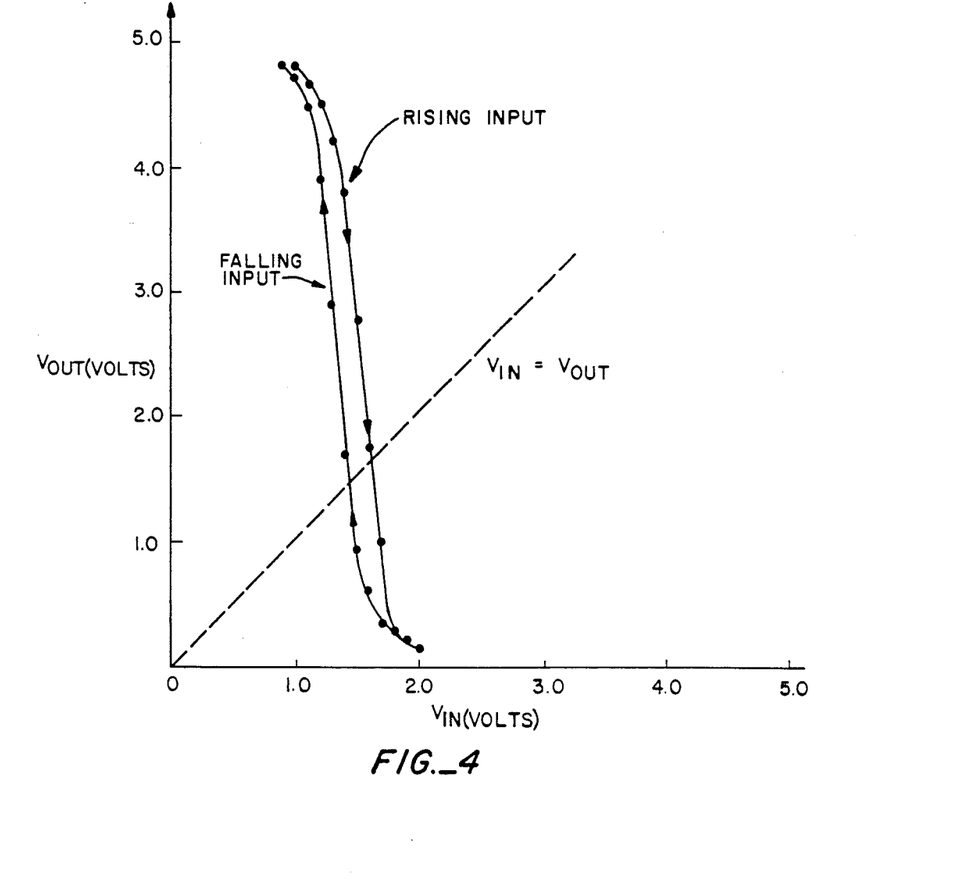
FIG. 4 shows a graph of the transfer characteristic curve of the second stage of the input buffer for a falling input voltage and for a rising input voltage.

The second stage of input buffer 22 comprises inverter 30 and transistors $N_4$ and $P_6$. Inverter 30 includes P-channel transistor $P_5$ whose source is connected to the positive voltage supply $V_{CC}$ and whose drain is connected to the drain of N-channel transistor $N_3$ whose source is connected to ground. The output signal of inverter 10 controls the gates of transistors $P_5$ and $N_3$. Transistor $P_5$ is a native P-channel transistor (i.e., a P-channel transistor without a threshold adjust implant) having a threshold voltage of $-1.6$ volts $\pm 0.2$ volts so that inverter 30 does not consume DC power when $V_{REF}$ has a value less than or equal to approximately 3.5 volts. Transistors $N_4$ and $P_6$ are included in input buffer 22 in order to provide some hysteresis so that the trigger point of inverter 30 when the voltage on node 14 is rising ($V_{TRIG,RISING}$) is higher than the trigger point of inverter 30 when the voltage on node 14 is falling ($V_{TRIG,FALLING}$). FIG. 4 shows the transfer function of the inverter 30 for both a rising and a falling input signal. Notice that the output signal of inverter 30 swings between 0 volts and $V_{CC}$. With transistors $N_4$ and $N_6$ present even if there is a small glitch in the voltage on node 14 at approximately the trigger point of inverter 30, the output signal of inverter 30 remains unaffected. This is shown in FIG. 3 which depicts a graph (not to scale) of input voltage (on node 14) versus the output voltage of inverter 30 (on node 16) as a function of time.

When the input voltage on node 14 rises above the threshold of pulldown transistor $N_3$, the falling voltage on output node 16 causes transistor $P_6$ to turn on which provides additional current to charge node 14 thereby increasing the trigger point of inverter 30. Conversely when the voltage on node 14 is falling, the rising voltage on output node 16 causes transistor $P_6$ to gradually turn off. The reduction in charging current through transistor $P_6$ causes the trigger point of inverter 30 to decrease. The gate and drain of N-channel transistor $N_4$ is tied to $V_{CC}$ which acts as a voltage clamp to prevent node 14 from charging up to $V_{CC}$.

The operation of operational amplifier 25 in FIG. 2 is explained with reference to FIG. 5. When operating in the TTL mode the control signals $\overline{PWRDN}$ and $\overline{CMOS}$ are set to 1, as previously explained. This causes the output signal PD of NAND gate 40 to be 0 volts. This low (0 volt) PD signal is supplied to inverter $INV_3$. The output signal $\overline{PD}$ of inverter $INV_3$ is thus high ($V_{CC}$). The high signal $\overline{PD}$ is applied to gate G of P-channel transistor $P_8$ turning off transistor $P_8$. The high signal $\overline{PD}$ is also applied to gate G of N-channel transistor $N_5$ turning transistor $N_5$ on. Thus the bias current network 50 of operational amplifier 25 is turned on. Bias current network 50 of operational amplifier 25 includes native P-channel transistor $P_7$ which has a threshold voltage of approximately $-1.6$ volts $\pm 0.2$ volts and N-channel transistor $N_5$. The source of transistor $P_7$ is connected to the positive voltage $V_{CC}$. The drain of transistor $P_7$ is connected to the drain of transistor $N_5$ whose source is connected to ground. The ratio of the ratio of the channel width to channel length of transistor $P_7$ to the ratio of the channel width to channel length of transistor $N_5$ is designed to be very large so that the voltage on node 8 with transistor $N_5$ being on is approximately $V_{CC} - |V_{TH,P7}|$, where $V_{TH,P7}$ is the threshold voltage of transistor $P_7$. In one embodiment, the channel width of transistor $P_7$ is 40 $\mu$m and the channel length of transistor $P_7$ is 2.5 $\mu$m; the channel width of transistor $N_5$ is 4 $\mu$m and the channel length of transistor $N_5$ is 40 $\mu$m. The purpose of biasing node 8 to the voltage level $V_{CC} - |V_{TH,P7}|$ is to establish a constant gate drive for transistor $P_9$ and $P_{10}$ which is independent of supply voltage ($V_{CC}$) variation. The gate drive for transistor $P_9$ is equal to $(V_{GS}-V_{TH})_{P9}$ which is $V_{node8} - V_{CC} - V_{TH,P9}$. If the voltage on node 8, $V_{node8}$, is equal to $V_{CC} - |V_{TH,P7}|$, then the gate drive for transistor $P_9$ is equal to $V_{CC} - |V_{TH,P7}| - V_{CC} - V_{TH,P9} = V_{TH,P7} - V_{TH,P9}$. As shown in the above expression, the gate drive for transistor $P_9$ is equal to the difference between the threshold voltage of two P-channel transistors (P-channel transistor $P_9$ and native P-channel transistor $P_7$). This difference in P-channel threshold voltages can be well controlled in production. The same analysis applies to transistor $P_{10}$, which has a gate drive equal to $V_{TH,P7} - V_{TH,P10}$. As transistor $P_8$ turns off and transistor $N_5$ turns on, the voltage on node 8 decreases, turning on the P-channel transistor $P_9$ which supplies bias current to the first stage amplifier 45. First stage amplifier 45 comprises P-channel transistors $P_{12}$ and $P_{13}$ and N-channel transistors $N_7$ and $N_8$. The sources of P-channel transistors $P_{12}$ and $P_{13}$ are connected to drain D of transistor $P_9$. Drain D of transistor $P_{12}$ is connected to the drains D and gates G of N-channel transistors $N_7$ and $N_8$ whose sources S are connected to ground. Gate G of transistor $P_{12}$ is the inverting input terminal of operational amplifier 25 and the gate G of P-channel transistor $P_{13}$ is the noninverting input terminal of operational amplifier 25. The first stage amplifier 45 is known in the art and is explained in Paul R. Gray and Robert G. Meyer, *Analysis and Design of Analog Integrated Circuits* (second edition) pp. 741–749, 762 (John Wiley & Sons, 1984), which is incorporated herein by reference. As the voltage on node 8 falls, P-channel transistor $P_{10}$ also turns on. Since PD equals 0 volts, N-channel transistors $N_6$ and $N_{10}$ whose gates are controlled by the signal PD, turn off. Since $\overline{PWRDN}$ is 1 (high) P-channel transistor $P_{11}$ is off. The second stage of amplifier 25 comprises transistors $P_{10}$, $N_6$, $N_9$, transistor $N_{14}$, and capacitor $C_3$. This second stage is also known in the CMOS amplifier art, see Gray and Meyer, *Analysis and Design of Analog Integrated Circuits* (second edition) supra, FIG. 12.45 at page 762. Capacitor $C_3$ and transistor $N_{14}$ serve to stabilize the operational amplifier at high frequency.

When it is desired to operate the TTL/CMOS input buffer 22 in the CMOS mode, i.e. where the input voltages on the input lead $V_{IN}$ of inverter 10 are between 0 volts and $V_{CC}$, typically 5 volts, the control signal $\overline{CMOS}$ equals 0 (low) and signal $\overline{PWRDN}$ equals 1 (high), which causes the output signal PD of NAND gate 40 to be high ($V_{CC}$) and the output signal $\overline{PD}$ of inverter $INV_3$ to be low (0 volts). The high signal PD is applied to the gate G of transistor $P_4$ (shown in FIG. 2) turning transistor $P_4$ off. Thus no current flows through the resistor divider network comprising resistors $R_1$ and $R_2$ and the voltage $V_{REF1}$ on node 1 falls to 0 volts. As shown in FIG. 5, the output signal of inverter $INV_3$, $\overline{PD}$, which is 0 volts, turns off N-channel transistor $N_5$ and turns on P-channel transistor $P_8$ which charges node 8 to $V_{CC}$ which turns off P-channel pullup transistors $P_9$ and $P_{10}$. Turning off transistor $P_9$ and $P_{10}$ cuts off the bias current to the first stage 45 and the second stage of operational amplifier 25. Since the power down signal $\overline{PWRDN}$ is high ($V_{CC}$) and is applied to the gate of P-channel transistor $P_{11}$, transistor $P_{11}$ turns off and N-channel transistor $N_{11}$ turns on. N-channel transistor $N_{10}$ is also on since the high signal PD is applied to the gate of transistor $N_{10}$. Thus the output voltage $V_{OUT}$ of operational amplifier 25 is pulled to ground. Note that N-channel transistor $N_9$ is off since the high signal PD is applied to the gate of N-channel transistor $N_6$ which pulls node 6 low (0 volts). Returning to FIG. 2, since the output voltage of operational amplifier 25 is 0 volts, P-channel transistor $P_3$ turns on thus pulling up the voltage on node 11, ($V_{REF}$), to $V_{CC}$. Thus in the CMOS mode of operation, both the resistor divider network comprising resistors $R_1$ and $R_2$ and the CMOS operational amplifier 25 are powered down so that they do not draw any current. Furthermore, the voltage on node 11 is charged to $V_{CC}$ so that the trigger point in the CMOS mode of inverter 10 increases (typically to approximately 2.5 volts when $V_{CC}$ is 5 volts) which provides a larger noise margin.

Figure 6:
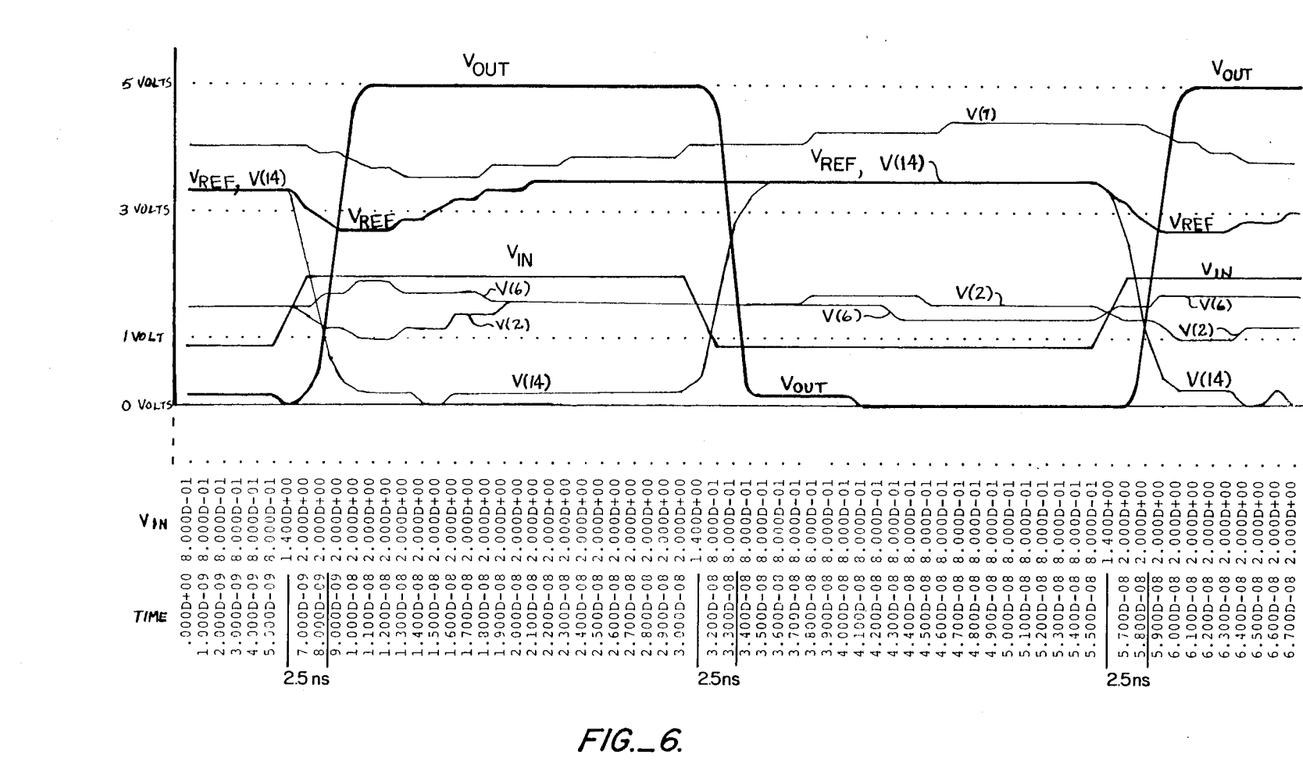
FIG. 6 shows a computer simulation of the TTL/CMOS buffer in the case where approximately 60 input buffers switch simultaneously.

A computer simulation of this TTL/CMOS buffer is shown in FIG. 6 which simulates the operation of input buffer 22 and reference voltage generator 20 in the case where approximately 60 input buffers similar to input buffer 22 switch simultaneously.

The embodiments described above are intended to be exemplary and not limiting. In view of the above disclosure, modifications will be obvious to one of ordinary skill in the art without departing from the scope of the invention.

I claim:

1. A circuit for translating an input signal having a first range of voltages to an output signal having a second range of voltages, said circuit comprising:
   a first inverter characterized by a trigger point at which said inverter switches states and having an input lead for receiving said input signal, an output lead for providing said output signal, a first power lead for connecting to a first power supply voltage, and a second power lead;
   means for supplying a second power supply voltage to said second power lead of said first inverter;
   means coupled to said first inverter for supplying a reference voltage to said second power lead of said first inverter; and
   means for receiving control signals for operating said circuit in different modes, so that in a first mode of operation a trigger point of said inverter is forced to a selected voltage level by said reference voltage supplied at said second power lead, and in a second mode of operation, said means for supplying a reference voltage is disabled and said second power supply voltage is provided to said second power lead.

2. A circuit as in claim 1 wherein said first mode of operation is a TTL mode and said second mode of operation is a CMOS mode.

3. A circuit as in claim 1, wherein said reference voltage is a first reference voltage, and further comprising means for generating a second reference voltage having a magnitude equal to said selected voltage level; and means for applying said first reference voltage to said second power lead in response to said second reference voltage.

4. A circuit as in claim 3 wherein said means for generating a second reference voltage comprises a voltage divider having an output node, said voltage divider comprising a first resistor having a first end connected to said output node and a second end for selectively being coupled to said second power supply voltage, and a second resistor having a first end connected to said output node and a second end for connecting to said first power supply voltage, said second reference voltage being generated on said output node of said voltage divider.

5. A circuit as in claim 3, wherein said means for applying said first reference voltage to said second power lead comprises:
an operational amplifier having a noninverting input lead, and inverting input lead and an output lead, said inverting input lead being connected to said means for generating said second reference voltage to receive said second reference voltage,
a reference input buffer stage comprising a P-channel enhancement mode transistor having a gate, a source, and a drain and an N-channel enhancement mode transistor having a gate, a source and a drain, said gate and said drain of said P-channel enhancement mode transistor being connected to said noninverting input lead and said gate and said drain of said N-channel enhancement mode transistor being connected to said noninverting input lead, said source of said N-channel enhancement mode transistor for connecting to said first power supply voltage,
means connected between said output lead of said operational amplifier and said source of said P-channel enhancement mode transistor for producing said first reference voltage for said second power lead on said source of said P-channel enhancement mode transistor of said reference input buffer stage.

6. A circuit as in claim 4 wherein said means for generating a second reference voltage further comprises a capacitor having a first plate connected to said output node and a second plate for connecting to said first power supply voltage.

7. A circuit as in claim 3 wherein said first inverter comprises:
a first transistor having a gate, a source, a drain and a channel of first conductivity type, said source of said first transistor being connected to said second power lead, said gate being connected to said input lead;
a second transistor having a gate, a source, a drain, and a channel of second conductivity type opposite said first conductivity type, said drain of said second transistor being connected to said drain of said first transistor and to said output lead, said source of said second transistor being connected to said first power lead, said gate of said second transistor being connected to said input lead.

8. A circuit as in claim 7 wherein said first transistor comprises a P-channel enhancement mode transistor, said source of said first transistor being said source of said P-channel enhancement mode transistor, said drain of said first transistor being said drain of said P-channel enhancement mode transistor and wherein said second transistor comprises an N-channel enhancement mode transistor wherein said drain of said second transistor comprises said drain of said N-channel enhancement mode transistor and said source of said second transistor comprises said source of said N-channel enhancement mode transistor.

9. A circuit as in claim 8 wherein said input signal having a first range of voltages comprises TTL voltages and wherein the ratio of the ratio of the channel width to channel length of said P-channel enhancement mode transistor to the ratio of the channel width to channel length of said N-channel enhancement mode transistor is selected so that the trigger point of said first inverter is approximately 1.4 volts and wherein said first reference voltage is supplied to said source of said P-channel enhancement mode transistor and is maintained sufficiently low to prevent said P-channel enhancement mode transistor from turning on when said TTL input signal is at logic high.

10. A circuit as in claim 5 wherein said means for producing comprises a P-channel enhancement mode transistor having a gate, a source and a drain, said gate being connected to said output lead of said operational amplifier, said drain being connected to said source of said P-channel enhancement mode transistor of said reference input buffer stage.

11. A circuit as in claim 5 wherein the ratio of the ratio of the channel width to channel length of said P-channel transistor of said reference input buffer stage to the ratio of the channel width to channel length of said N-channel transistor of said reference input buffer stage is the same as the corresponding ratio for said P-channel and said N-channel transistors of said first inverter.

12. A circuit as in claim 1 further comprising a second inverter having an input lead connected to said output lead of said first inverter, a first power lead for connecting to said first power supply voltage, a second power lead for connecting to said second power supply voltage and an output lead.

13. A circuit as in claim 10 wherein said second inverter comprises a native P-channel transistor having its source connected to said second power lead of said second inverter, a gate connected to said input lead of said second inverter, and a drain connected to said output lead of said second inverter, and an N-channel transistor having a source connected to said first power supply voltage, a gate connected to said input lead of said second inverter, and a drain connected to said output lead of said second inverter.

14. A circuit as in claim 1 wherein said second power supply voltage is higher than said reference voltage.

15. A circuit as in claim 10 further comprising means connected between said output lead of said second inverter and said input lead of said second inverter for causing a trigger point of the second inverter to be lower when a voltage on said input lead of said second inverter is falling than when said voltage on said input lead of said second inverter is rising.

16. A circuit for translating an input signal having a first range of voltages to an output signal having a second range of voltages, said circuit comprising:
a first inverter characterized by a trigger point at which said inverter switches states, said first inverter having
an input lead for receiving said input signal,
an output lead,
a first power lead for connecting to a first power supply voltage, and
a second power lead; said first inverter comprising
a P-channel enhancement mode transistor having a gate, a source, and a drain, said source of said P-Channel transistor being connected to said second power lead, said gate being connected to said input lead;
an N-channel enhancement mode transistor having a gate, a source, and a drain, said drain of said N-channel transistor being connected to said drain of said P-channel transistor, said source of said N-channel transistor being connected to said first power lead, said gate of said N-channel transistor being connected to said input lead;

means, connected to said second power lead, for forcing the trigger point of said first inverter to a selected voltage level, wherein said means for forcing comprises:

means for generating a first reference voltage having a magnitude equal to said selected voltage level; and means coupled to said second power lead for generating a second reference voltage for said second power lead in response to said first reference voltage;

wherein said means for generating said second reference voltage for said second power lead comprises:

an operational amplifier having a noninverting input lead, an inverting input lead and an output lead, said inverting input lead being connected to said means for generating a first reference voltage to receive said first reference voltage;

a reference input buffer stage comprising a P-channel enhancement mode transistor having a gate, a source, and a drain and an N-channel enhancement mode transistor having a gate, a source and a drain, said gate and said drain of said P-channel enhancement mode transistor being connected to said noninverting input lead and said gate and said drain of said N-channel enhancement mode transistor being connected to said noninverting input lead, said source of said N-channel enhancement mode transistor for connecting to said first power supply voltage; and means connected between said output lead of said operational amplifier and said source of said P-channel enhancement mode transistor for producing said second reference voltage for said second power lead on said source of said P-channel enhancement mode transistor of said reference input buffer stage.

17. A circuit as in claim 16 further comprising means for deactivating said operational amplifier and said means for generating a first reference voltage in response to a set of control signals, so that said means for generating said first reference voltage and said operational amplifier do not consume DC power, and for supplying a second power supply voltage to said second power lead of said first inverter.

18. A circuit for translating an input signal having a first range of voltages to an output signal having a second range of voltages, said circuit comprising:

a first inverter characterized by a trigger point at which said inverter switches states and having an input lead for receiving said input signal, an output lead, a first power lead for connecting to a first power supply voltage, and a second power lead;

means, connected to said second power lead for receiving control signals, and for operating said circuit in different modes, so that in a first mode of operation said trigger point of said first inverter is forced to a selected voltage level by a reference voltage supplied at said second power lead, and in a second mode of operation, a second power supply voltage is provided to said second power lead;

further comprising a second inverter having an input lead connected to said output lead of said first inverter, a first power lead for connecting to said first power supply voltage, a second power lead for connecting to said second power supply voltage and an output lead; and further comprising means connected between said output lead of said second inverter and said input lead of said second inverter for causing a trigger point of the second inverter to be lower when a voltage on said input lead of said second inverter is falling than when said voltage on said input lead of said second inverter is rising.

* * * * *